(12) United States Patent
Baldwin et al.

(10) Patent No.: US 7,026,964 B2
(45) Date of Patent: Apr. 11, 2006

(54) GENERATING AND SEARCHING COMPRESSED DATA

(75) Inventors: James Armand Baldwin, Redwood City, CA (US); Peter T. Barrett, San Francisco, CA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 11/082,391

(22) Filed: Mar. 17, 2005

(65) Prior Publication Data

US 2005/0219085 A1    Oct. 6, 2005

Related U.S. Application Data

(63) Continuation of application No. 10/062,153, filed on Jan. 31, 2002, now Pat. No. 6,909,384.

(51) Int. Cl.
*H03M 7/30* (2006.01)
*G06F 3/00* (2006.01)
*G06F 13/00* (2006.01)

(52) U.S. Cl. .......................... 341/87; 725/39; 725/54; 711/170; 707/101

(58) Field of Classification Search ................. 341/55, 341/87; 725/39, 40, 53, 54; 707/3, 7, 101, 707/104.1
See application file for complete search history.

(56) References Cited

U.S. PATENT DOCUMENTS

| | | | |
|---|---|---|---|
| 3,613,086 A * | 10/1971 | Loizides et al. | 707/101 |
| 5,548,338 A | 8/1996 | Ellis et al. | 725/54 |
| 5,652,613 A * | 7/1997 | Lazarus et al. | 725/50 |
| 5,737,733 A | 4/1998 | Eller | 703/3 |
| 5,758,259 A | 5/1998 | Lawler | |
| 5,812,999 A * | 9/1998 | Tateno | 707/3 |
| 5,844,620 A | 12/1998 | Coleman et al. | 725/54 |
| 6,032,197 A | 2/2000 | Birdwell et al. | |
| 6,173,330 B1 * | 1/2001 | Guo et al. | 341/81 |

* cited by examiner

*Primary Examiner*—Howard L. Williams
(74) *Attorney, Agent, or Firm*—Lee & Hayes, PLLC

(57) ABSTRACT

Data destined for a client is compressed at a server in a manner that produces a compressed data string that can be searched in its compressed state. The server constructs a code table that assigns codes from a standard code set (e.g., ASCII code set) that are normally unused to selected character pairs in the data string (e.g., the most frequently occurring character pairs). During compression, the selected character pairs are replaced with the corresponding codes. Identifiers are inserted into the compressed data string to separate substrings. To search the compressed data string at the client, a search query is compressed and compared to the compressed substrings. The substring identifiers are used to quickly locate each successive compressed substring. When a match is found, the matching substring is decompressed by replacing the code in the compressed substring with the corresponding character pair in the code table.

18 Claims, 15 Drawing Sheets

TABLE
CONSTRUCTION
(902 AND 904)

1002 INITIALIZE COUNT AND CODE TABLES

↓

1004 PASS THROUGH DATA STRING AND COUNT CHARACTER PAIRS, TRACKING COUNTS IN COUNTS TABLE

↓

1006 DETERMINE N CHARACTER PAIRS WITH HIGHEST COUNTS

↓

1008 MARK CHARACTERS FOUND IN DATA STRING AS USED IN CODE TABLE

↓

1010 ASSIGN UNUSED CODES IN CODE TABLE TO PAIRS WITH HIGHEST COUNTS

```
                          ┌ 1200

L    R
ASCII  #
 00    0   0    0
           :    :
           :    :
           :    :
 65   101  0    1  ←
 68   104  0    1  ←    USED CODES
           :    :        FOR SINGLE
                         CHARACTERS
 74   116  0    1  ←
           :    :
           .
 8f   143  t    h  ←
           :    :       UNUSED CODES
           :    :       ASSIGNED TO
                         CHARACTER
                           PAIRS
 bd   189  t    —  ←
           :    :
 ff   255  0    1
```

CODE TABLE

*Fig. 12*

DECOMPRESSION
(916)

1502 RECEIVE COMPRESSED DATA STRING

1504 PASS THROUGH COMPRESSED STRING, SUBSTITUTING CHARACTER PAIRS IN CODE TABLE FOR CODES IN COMPRESSED STRING

1506 OUTPUT DECOMPRESSED DATA STRING

GENERATING AND SEARCHING COMPRESSED DATA

RELATED APPLICATION

This is a continuation of U.S. patent application Ser. No. 10/062,153, which was filed Jan. 31, 2002 and assigned to Microsoft Corporation, now U.S. Pat. No. 6,909,384, and is hereby incorporated by reference.

TECHNICAL FIELD

This invention relates to generating and searching compressed data. More particularly, this invention relates to client-server architectures (e.g., television entertainment architectures) in which the server generates compressed data (e.g., program data for an electronic program guide) that can be readily searched at the client (e.g., a low resource set-top box) in the compressed state.

BACKGROUND

Electronic program guides (EPGs) enable TV viewers to navigate through an onscreen program guide and locate shows. With the guides, viewers can look at schedules of current and future programming, set reminders for upcoming programs, or enter instructions to record one or more shows.

Program data for an EPG is stored in the client memory. The amount of EPG data available for the EPG is dependent upon the resource environment at the client. In a low-resource environment, meaning the client has limited memory and/or processing resources, the amount of memory reserved for program data and the ability to perform operations on the data, such as searching, are limited.

Accordingly, for such low-resource environments, there is a need for techniques to compress the EPG data for more efficient storage at the client, yet in a manner that allows effective searching with limited processing capabilities.

SUMMARY

Data destined for a client is compressed at a server in a manner that produces a compressed data string that can be searched in its compressed state. The server constructs a code table that assigns codes from a standard code set (e.g., ASCII code set) that are normally unused to selected character pairs in the data string (e.g., the most frequently occurring character pairs). During compression, the selected character pairs are replaced with the corresponding codes. Identifiers are inserted into the compressed data string to separate substrings.

The compressed data string and code table are delivered to the client. To search the compressed data string, a search query is first compressed and then compared to the compressed substrings. The substring identifiers are used to quickly locate each successive compressed substring. When a match is found, the matching substring is decompressed by replacing the code in the compressed substring with the corresponding character pair in the code table.

BRIEF DESCRIPTION OF THE DRAWINGS

FIG. 12 illustrates an exemplary code table used to assign codes for corresponding character pairs found to occur most often in the input data string.

DETAILED DESCRIPTION

The following discussion is directed to television entertainment systems, such as interactive TV networks, cable networks that utilize electronic program guides, and Web-enabled TV networks. Clients in such systems range from full-resource clients with substantial memory and processing resources (e.g., TV-enabled personal computers, TV recorders equipped with hard-disks) to low-resource clients with limited memory and/or processing resources (e.g., traditional set-top boxes). While aspects of the systems and methods described below can be used in any of these systems and for any types of clients, they are well suited for systems with low-resource clients. Hence, the following discussion describes the systems and methods in the context of a low-resource environment.

Television Entertainment System

Figure 1:
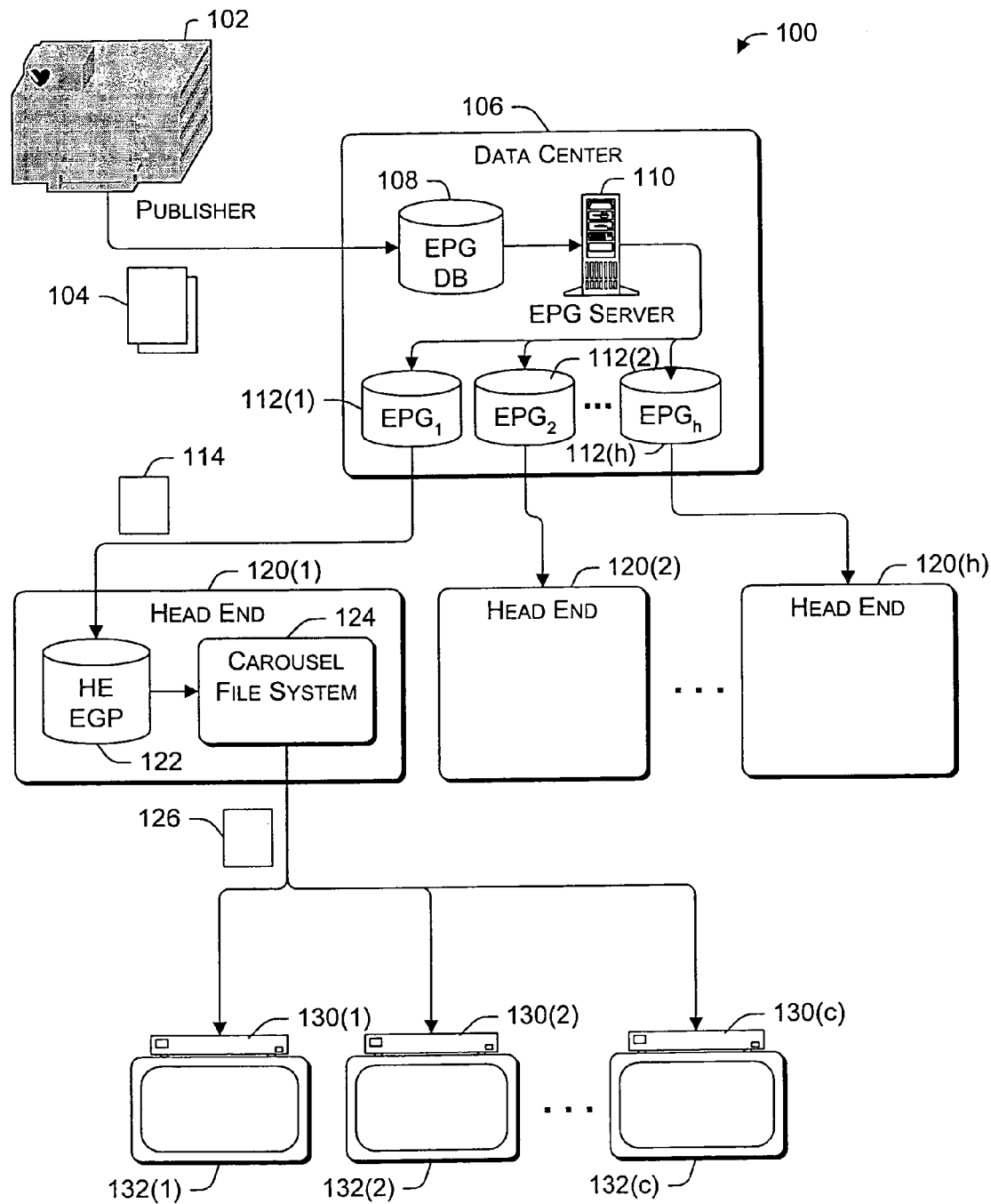
FIG. 1 illustrates a television entertainment system including a publisher to generate program data, a data center to process the program data, and one or more head ends to distribute the program data to multiple clients.

FIG. 1 shows a television entertainment system 100 that facilitates distribution of program data from a publisher to the viewers. System 100 includes a publisher 102 that creates the program data. One example of a publisher 102 is the Tribune Corporation, which generates data for interactive television networks. As used herein, program data refers to the type of data that might be used by an electronic program guide (EPG) and/or to facilitate interactive television functionality. Program data includes program titles, ratings, characters, description, actor names, year made, station call letters, time schedules, channel numbers, and so on. The terms "program data" and "EPG data" are used interchangeably throughout this disclosure.

The EPG data is transferred as an electronic file 104 from the publisher 102 to a data center 106. As one example, the program data 104 is transferred using a file transfer protocol (FTP) over a TCP/IP network (e.g., Internet, UNIX, etc.) to the data center 106. The electronic file 106 is stored in an EPG database 108 at the data center 106.

The original version of the EPG data contains all of the programming information for multiple days. An EPG server 110 resides at the data center 106 to process the EPG data prior to distribution. The processing involves one or more techniques to condition the EPG data so that a low resource client can handle the data more effectively. Low resource clients, such as a set top box, are typically characterized as having limited memory and/or processing resources. Such clients may not be able to store the entire original version of the EPG data. With limited resources at the client, the processes performed by the EPG server 110 are helpful to precondition the EPG data into a more suitable form for storage and processing at the client.

Among other processes, the EPG server 110 is configured to reduce the amount of EPG data so that it can be stored at low-resource clients. The EPG server 110 might also alter the format or structure of EPG data 104 to enable easier searching or other processes at the clients. The EPG server 110 might also compress the EPG data prior to its distribution.

The EPG server 110 creates different versions of the program data for different head end services to account for programming preferences and lineups. For example, the EPG server 110 limits the EPG data to those channels that are relevant to the respective head ends. In the illustrated example, the EPG server 110 creates multiple versions of the EPG data, which are designated as $EPG_1$, $EPG_2$, ..., $EPG_h$, and stores them in respective databases 112(1), 112(2), ..., 112(h). The data center 106 transfers the head end versions of the EPG data as electronic files 114 to associated head end services 120(1), 120(2), ..., 120(h) using, for example, FTP or other suitable transfer protocols over a network.

At individual head end services, as represented by service 120(1), the EPG data is stored in a head end database 122. A carousel file system 124 repeatedly broadcasts the EPG file 126 over an out-of-band (OOB) channel to the clients 130(1), 130(2), ..., 130(c). The distributed EPG file 126 may or may not be identical to the file 114 received from the data center 106. Distribution from the head ends 120 to the clients 130 may be accommodated in a number of ways, including cable, RF, microwave, network (e.g., Internet), and satellite.

In the illustrated implementation, the clients 130 are embodied as set top boxes (STBs) connected to associated televisions 132(1), 130(2), ..., 132(c). The clients 130 are often equipped with sufficient processing and storage capabilities to store and run an operating system and a few programs. Examples of programs stored on a client might include a Web browser, an electronic programming guide, a personal scheduler, and so forth. Although the STBs are shown separately from the television sets, they may alternatively be built into the television sets as integral units. Furthermore, in other implementations, the clients may be embodied as other devices capable of handling EPG data, such as a broadcast-enabled computer, an information appliance, or the like.

Exemplary EPG Server

Figure 2:
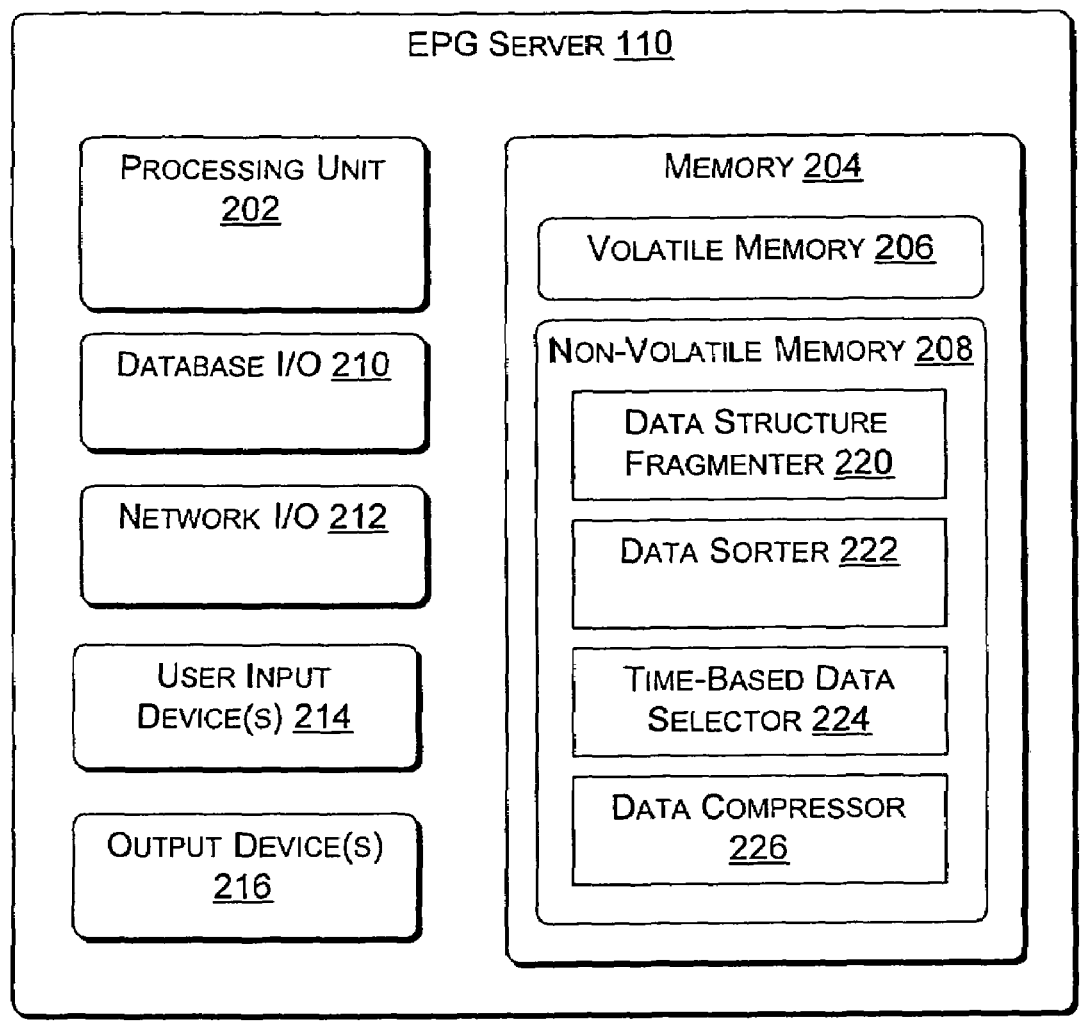
FIG. 2 is a block diagram of a server computer resident at the data center to process the program data.

FIG. 2 shows an exemplary implementation of the EPG server 110. It has a processing unit 202 and memory 204. Memory 204 includes volatile memory 206 (e.g., RAM) and non-volatile memory 208 (e.g., ROM, flash, floppy disk, hard disk, CD-ROM, disk array, etc.). The server 110 may be further equipped with a database I/O 210 to interface with the EPG database 108 and/or version databases 112(1)–112(h) and a network I/O 212 to provide access to one or more networks. The server 110 may optionally be equipped with one or more input devices 214 (e.g., keyboard, mouse, track ball, touch panel screen, etc.) and one or more output devices 216 (e.g., display, printer, etc.).

One or more programs are stored in memory 204 and executed on processing unit 202 to process the EPG data. The programs include a data structure fragmenter 220, a program table constructor 222, a time-based data selector 224, and a data compressor 226. The EPG server 110 also runs an operating system (not shown), such as a Windows® brand operating system from Microsoft Corporation, or a Unix-based operating system.

The various processes performed by the EPG server 110 are intended to place the EPG data in better condition for handling by the low resource client. The data structure fragmenter 220 pre-formats the data at the server for use by the client. The client 130 has previously designated an arbitrary data set size for a particular application, such as an EPG application, and allocates a block of memory in segments of that size. The arbitrary size is communicated to the EPG server 110, and the data structure fragmenter 220 "fragments" the data in advance of delivery to the client 130. The client-designated arbitrary data size is thus guaranteed by the server 110 to be the size of data transmitted to the client. Therefore, when the client 130 receives the data, the client can allocate the data packets to the pre-allocated segments in memory without making system calls to the memory. One exemplary fragmentation process is described below in more detail with reference to FIG. 8.

The data sorter 222 pre-sorts EPG data to improve searching at the client. The EPG data is pre-sorted according to a type of field, such as a title. The data sorter 222 constructs a table with the pre-sorted data and this table is used by the client to facilitate fast searches, even though the client has limited processing; resources. One exemplary sorting process is described below in more detail with reference to FIGS. 6 and 7.

The time-based data selector 224 selects which program data to be included in the file to be downloaded to the client. Low resource clients may not be able to store and display program schedule information for multiple days because of limited memory. The time-based selector 224 selectively stores more data for a current time period represented by the EPG (e.g., the current day) and progressively less data over time for subsequent time units (e.g., next several days). This enables a rich display of information for the time period in which viewers are most likely interested, while offering some additional subset of data for future programming. One exemplary selection process is described below in more detail with reference to FIGS. 4 and 5.

The data compressor 226 can be used to compress data destined for the client to a compressed format that remains easily searchable at the client. In one implementation, the data compressor 226 makes an initial pass through the data and constructs a table identifying the most frequently used character sequences. The data compressor constructs a code table that assigns codes from a standard code set (e.g., ASCII code set) that are normally unused to selected character pairs in the data (e.g., the most frequently occurring character pairs). During one or more subsequent passes, the data compressor 226 compresses the data string by substituting a previously unused code value for the selected character pairs. The compressed data file and code table can then be downloaded to the client for decompression. One exemplary process for generating searchable compressed data is described below in more detail with reference to FIGS. 9–15.

It is noted that the processes carried out by the EPG server are described as being implemented in software. However, in alternative implementations, some or all of these processes may be implemented in firmware and/or hardware.

Exemplary Client

Figure 3:
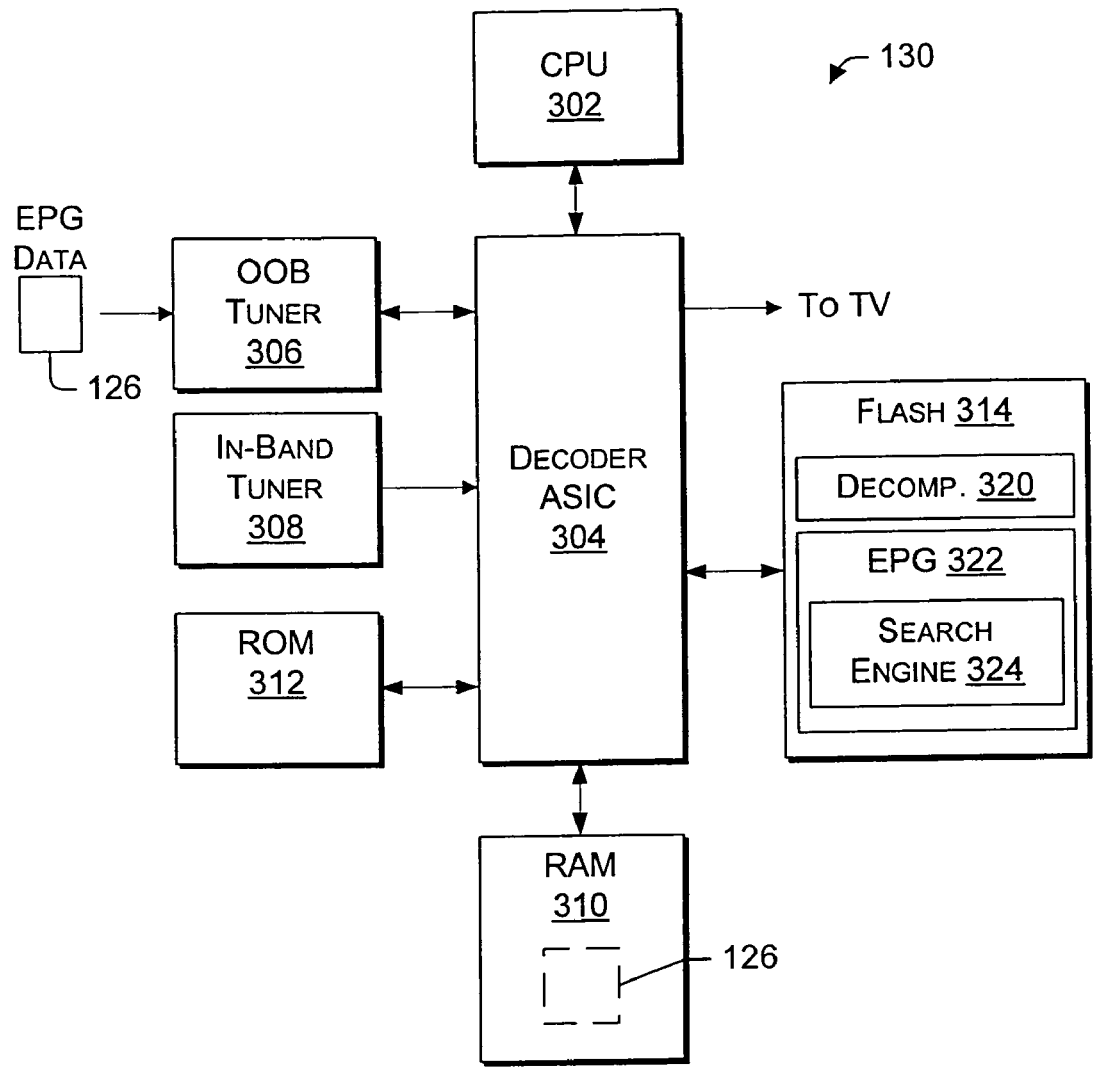
FIG. 3 is a block diagram of an exemplary client implemented as a set top box.

FIG. 3 shows an exemplary client 130 implemented as a set-top box. The client 130 has a central processing unit (CPU) 302 coupled to a decoder ASIC (application specific integrated circuit) 304. In addition to decoder circuitry, ASIC 304 may also contain logic circuitry, bussing circuitry, and a video controller. The client 130 further includes an out-of-band (OOB) tuner 306 to tune to the broadcast channel over which the EPG data file 126 is downloaded. One or more in-band tuner 308 is also provided to tune to various television signals. These signals are passed through the ASIC 304 for audio and video decoding and then to an output to the television set. With the tuners and ASIC 304, the client is equipped with hardware and/or software to receive and decode a broadcast video signal, such as an NTSC, PAL, SECAM or other TV system video signal and provide video data to the television set.

One or more memories are coupled to ASIC 304 to store software and data used to operate the client. In the illustrated implementation, the client has random access memory (RAM) 310, read only memory (ROM) 312, and flash memory 314. RAM 310 stores data used by the client, including the EPG data file 126 as well as any compression table used to decompress the file. ROM 312 stores an operating system (not shown).

One or more programs may be stored in the ROM 312 or in the flash memory 314. In the illustrated example, the flash memory 314 stores a decompression program 320 that can be executed to decompress the EPG data file 126. An EPG program 322 is also stored in the flash memory 314 to operate on the EPG data 126. The EPG program 322 may include a search engine 324 to search the EPG data (in a compressed or uncompressed state) in response to queries submitted by the viewer. The search engine might be used, for example, to locate particular television shows by title, or find shows with a particular rating, or identify programs with selected actors.

The client 130 may further include other components, which are not shown for simplicity purposes. For instance, the client is typically equipped with hardware and/or software to present a graphical user interface to a viewer, by which the viewer can navigate the EPG, or (if enabled) to access various Internet system network services, browse the Web, or send email. Other possible components might include a network connection (e.g., modem, ISDN modem, etc.) to provide connection to a network, an IR interface, display, power resources, etc. A remote control may further be provided to allow the user to control the client.

Time-Based EPG Data Selection

Low resource client 130 has limited memory resources. For example, set top boxes are typically manufactured with a fixed amount of memory that satisfies the manufacturer's price/performance criteria. A portion of this memory is allocated to hold EPG data. The amount of EPG data to be transmitted down to the set top box might be expected to consume, for example, no more than 500K bytes of memory.

Accordingly, one process performed on the EPG data prior to delivery to the client concerns selecting which items of the EPG data to send to the client. Items believed to be of greater importance to the viewer are selected for transmission, whereas items deemed to be of less importance are not. In the example illustrated in FIG. 1, the data selection process is performed by the EPG server 110 of the data center 106, and particularly by the time-based data selector 224. The EPG server 110 examines the publisher-created EPG data 104 stored in the EPG database 108 and selectively resolves that original EPG data into a smaller data set. It is noted that the EPG data selection process may be performed at other computing sites in system 100, including at the head end services 120.

One factor in determining what constitutes suitable items of the EPG data is time. With limited memory at the client, the selection process attempts to ensure that at least the timeliest EPG data is downloaded to the client. EPG data for future programs can be added to the downloaded file if there is available memory. In one implementation, time increments used in the selection process correspond to 24-hour days. Thus, the selection process chooses more EPG data for the current day and progressively less EPG data over time for subsequent days. This enables the richest display of information for the day in which viewers are most likely look at program schedules, but still provides some subset of data for future programming.

Figure 4:
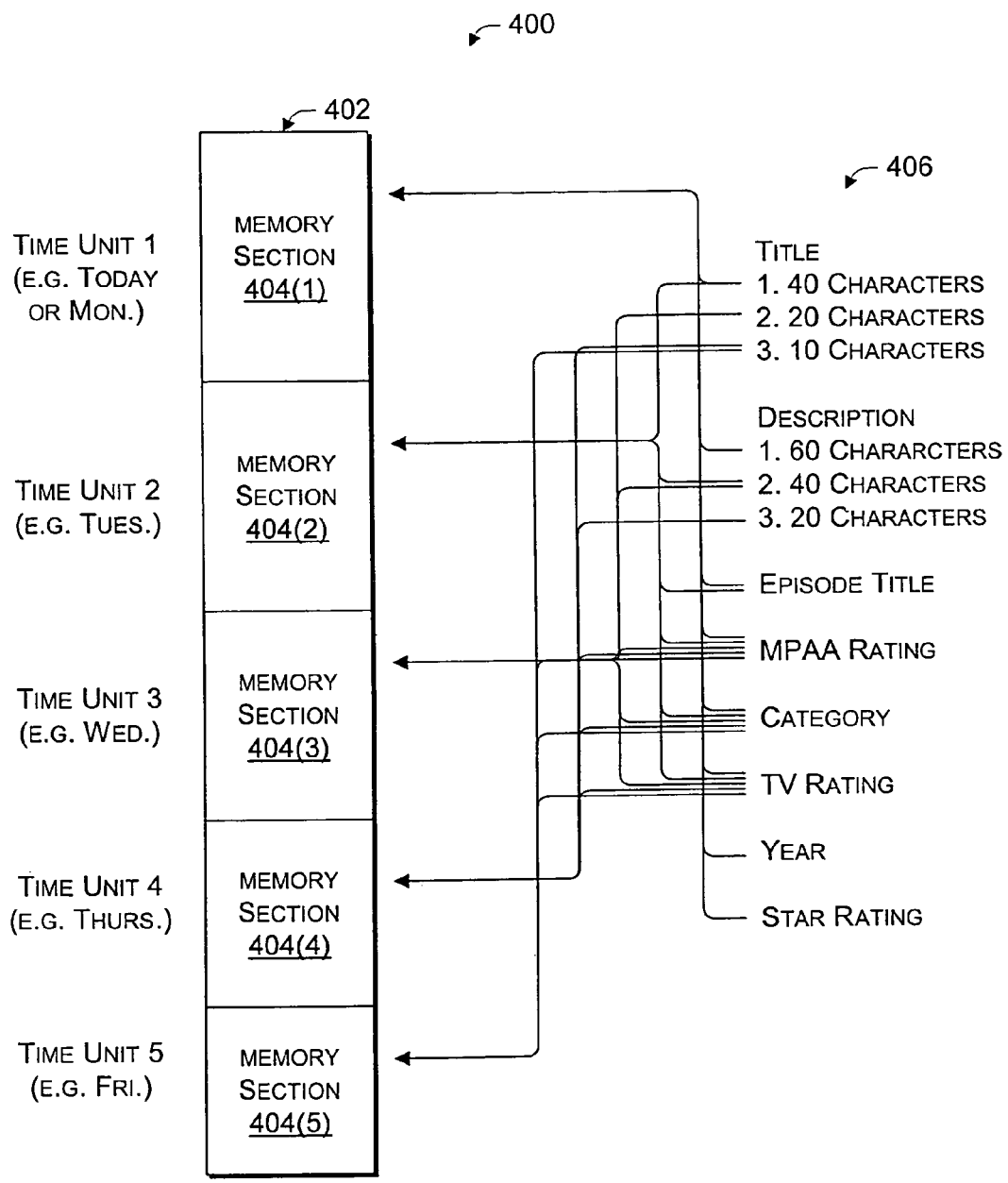
FIG. 4 illustrates memory space available for storing program data. The memory space is disproportionately allocated among multiple time units such that different amounts of program data are placed in the different-size sections of memory.

FIG. 4 illustrates one exemplary implementation of the selection process 400. The process utilizes a memory 402 that represents the client memory that will be used to store the EPG data. The size of memory 402 thus corresponds to the size of the client memory. Memory 402 is disproportionately allocated among multiple time units represented in the EPG. Different-size sets of EPG data are then selected to fill the allocated memory portions.

The time units can be over any predetermined interval, with one suitable size being a 24-hour day. Accordingly, in this example, the memory space 402 is allocated as five sections 404(1)–404(5) for a five-day period from a current day (e.g., Monday) to five days in the future (e.g., Friday). The amount of memory allocated for each day is dependent upon how close in time the day is to the current day. This is illustrated by the largest allocated section. 404(1) 11 corresponding to the current day (e.g., Monday) and the smallest allocated section 404(5) corresponding to the furthest day away from the current day (e.g., Friday).

At the EPG server 110, the data selector 224 chooses items of the EPG data to be placed in each memory section 404 according to how much space is allocated for that time unit. Since the current day has the most allocated space, more EPG data pertaining to current-day programming is selected for inclusion, in the EPG file to be sent to the client. For the furthest day away (e.g., Friday), less EPG data for Friday is selected for inclusion in the EPG file.

For discussion purposes, a sample of EPG data 406 is listed in FIG. 4. Among other items, the EPG data for a program typically includes a program title, a description, an episode title, an MPAA rating, a category, a TV rating, a year that the show was made, and a star rating. Some data may be represented in multiple ways to accommodate space concerns. For instance, title data might consist of three versions: a full title with 40 or less characters, a mid-length title with 20 or less characters, and a short title with 10 or less characters. Similarly, there might be three versions of the description.

Different collections of the EPG data 406 are placed in the various memory sections 404(1)–(5) depending upon available space allocated for that day. To illustrate this point, suppose that the data selector 224 places the following collection of EPG data in the memory section 404(1) associated with Monday:

40 character title
    60 character description
    episode title
    MPAA rating
    category
    TV rating
    Year
    Star Rating Then, for the smaller memory section 404(5) associated with Friday, the data selector 224 might select only the following collection of EPG data:

10 character title
    MPAA rating
    category
    TV rating

The EPG data included in Friday's memory section 404(5) is sufficient for the viewer to browse the future programming and to set various conditions, such as reminders or recording events.

Figure 5:
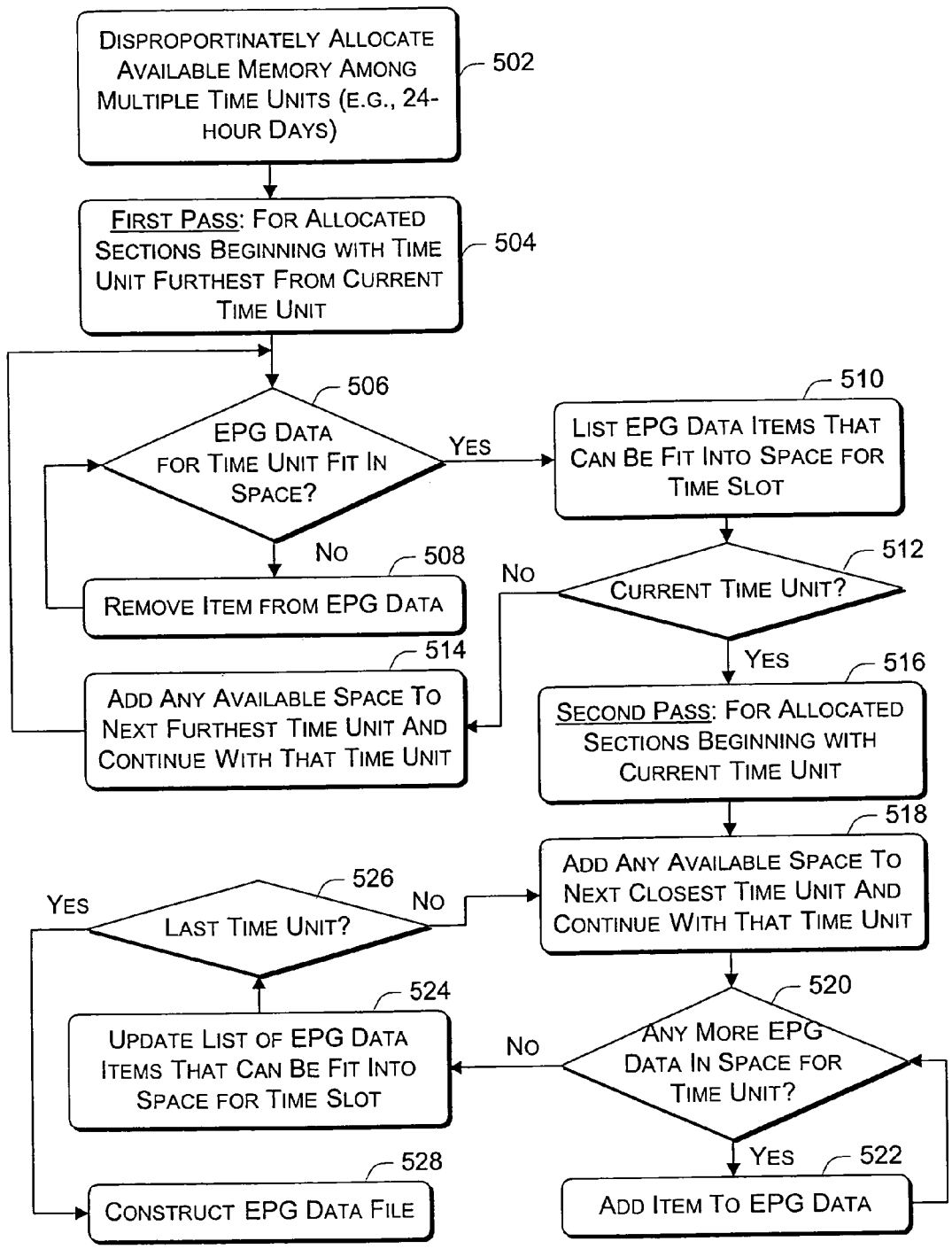
FIG. 5 is a flow diagram of the data selection process used to determine which items of program data are placed in the allocated memory for various time units.

FIG. 5 shows one example of a selection process 500 performed by the time-based data selection program 224 executing at the EPG server 110. Generally, the process 500 can be thought of as two passes over the time-divided memory structure to dynamically store as much EPG data in each of the memory sections. The first pass begins at the day furthest in the future and works backwards toward the present day. The second pass starts with the current day and works forward into the future. In both passes, unused space from one day is shifted to the next day. The process 500 may be implemented in software, firmware, hardware, or a combination of these. The process is illustrated as a set of operations that may be implemented as computer-executable instructions that can be executed by a computer, such as EPG server 110.

At block 502, the process allocates disproportionate amounts of the memory 402 (FIG. 4) among the time units. For discussion purposes, suppose the total amount of memory available for EPG data is 500K bytes and the process allocates this memory over five 24-hours time slots as represented in FIG. 4. As an initial allocation, suppose the section 404(1) for Monday is allocated 120K bytes, the section 404(2) for Tuesday is allocated 110K bytes, the section 404(3) for Wednesday is allocated 100K bytes, the section 404(4) for Thursday is allocated 90K bytes, and the section 404(5) for Friday is allocated 80K bytes.

At block 504, the first or future-to-present pass is initiated, starting with the section corresponding to the furthest time in the future for which there is EPG data. Here, there are five days of program listings and the fifth or furthest day out from Monday is Friday. At block 506, the process determines whether all of the EPG data for Friday will fit in the allocated space 404(5) (e.g., 80K bytes). If there is more EPG data than available space (i.e., the "No" branch from block 506), the process removes one or more items of EPG data (block 508) and reevaluates whether the reduced data set fits in the allocated space. This loop is repeated until a set of EPG data that fits the space is found.

The removal of EPG data may be handled in a number of ways. For instance, the EPG data may be prioritized in some manner that establishes the order in which items are removed. For the EPG data shown in FIG. 4, one possible order might be as follows:

1. eliminate Star Rating
    2. eliminate Year
    3. eliminate 60 character description
    4. eliminate 40 character title
    5. eliminate 40 character description
    6. eliminate 20 character title
    7. eliminate 20 character description
    8. eliminate 10 character title
    9. eliminate episode title
    10. eliminate MPAA rating
    11. eliminate Category
    12. eliminate TV Rating Another possible approach is to assign level-of-detail values that correspond to diminishing sets of EPG data. For instance, a first value might represent the fewest number of acceptable items in the EPG data for a give time unit; another value might represent the next biggest set of EPG data; and so one. With this approach, the operation of block 508 is to find the appropriate level-of-detail value for the available memory space.

Once the appropriate amount of EPG data is found to fit the allocated space for Friday (i.e., the "yes" branch from block 506), the EPG data (or corresponding level-of-detail value) is temporarily stored memory (block 510). At block 512, the process determines whether all allocated time units in the first pass have been considered. In this case, only Friday has been evaluated. Thus, at block 514, the process continues to the next time unit, which is Thursday in our example. Additionally, the process may optionally add any available space into the allocation for the next day to be considered. For instance, suppose that the first iteration found that 78K bytes of EPG data fit the allocated 80K bytes. The additional 2K bytes would then be shifted to the memory section 404(4) for Thursday to enlarge that allocation to 92K bytes of memory.

The first pass through the available memory continues for each day, from Friday back to Monday. With each iteration, any additional memory space is moved to the next day to accept potentially more EPG data for that day.

Once the EPG data set for the current time unit (i.e., Monday) is found and recorded at block 510, the process begins the second pass at block 516. This present-to-future pass begins with the next closest time unit (i.e., Tuesday). Any leftover space that was not used to hold the EPG data for Monday is added back to the available space for Tuesday to see if any additional data can now be fit into Tuesday's allocated space (block 518).

At block 520, the process determines whether any more EPG data for Tuesday will fit in the allocated space. With the additional space moved over from Monday, there may be just enough space to add one or more EPG data items or modify the level-of-detail value. If more EPG data can be added, the process enlarges the EPG data for that day (block 522) and reevaluates with the enlarged data set whether even more data may be included. This loop is repeated until a set of EPG data that fits the space is found.

Once the appropriate amount of EPG data is found to fit the allocated space for Tuesday (i.e., the "no" branch from block 520), the data items and/or corresponding level-of-detail value associated with this day is updated to reflect the additional subject matter (block 524). At block 526, the process determines whether all allocated time units in the second pass have been considered. If not, the next iteration is performed for the next time unit (e.g., Wednesday) and any available space is moved into the allocation for that time unit. The second pass through the available memory continues for each day, from Tuesday back to Friday.

When all time units are considered (i.e., the "yes" branch from block 526), the EPG data file is constructed (block 528). The resulting file includes varying amounts of data with more EPG data being contained in the current day and progressively less EPG data for subsequent days. The space used to store the various days of EPG data will most likely be different from the initially allocated amounts as a result of the two-pass process. As an example, the final distribution of available memory space might be 123K for Monday's EPG data, 109K for Tuesday's EPG data, 104K for Wednesday's EPG data, 88K for Thursday's EPG data, and 76K for Friday's EPG data. In any event, the EPG data is guaranteed to fit within the pre-allocated space at the client (e.g., the 500K bytes of memory).

Table Arrangement of Sorted EPG Data

Low resource client 130 has limited memory resources (e.g., 500K bytes) and limited processing resources to perform operations on the data, such as searching. Accordingly, one process performed on the EPG data prior to delivery to the client concerns structuring the EPG data in a way that facilitates searching at the client. The EPG data is pre-sorted at the EPG server 110 according to data type, such as by titles of programs. In one example, the EPG server 110 can be used to pre-sort those items of EPG data selected as a result of the time-based selection process described above with respect to FIGS. 4 and 5.

The pre-sorted EPG data is arranged in tables that are delivered and stored at the client. The pre-sorted tables are conducive to fast searches at the client, even though the client has limited processing capabilities. It is noted that the sorting process may be performed at other computing sites in system 100, including at the head end services 120.

Figure 6:
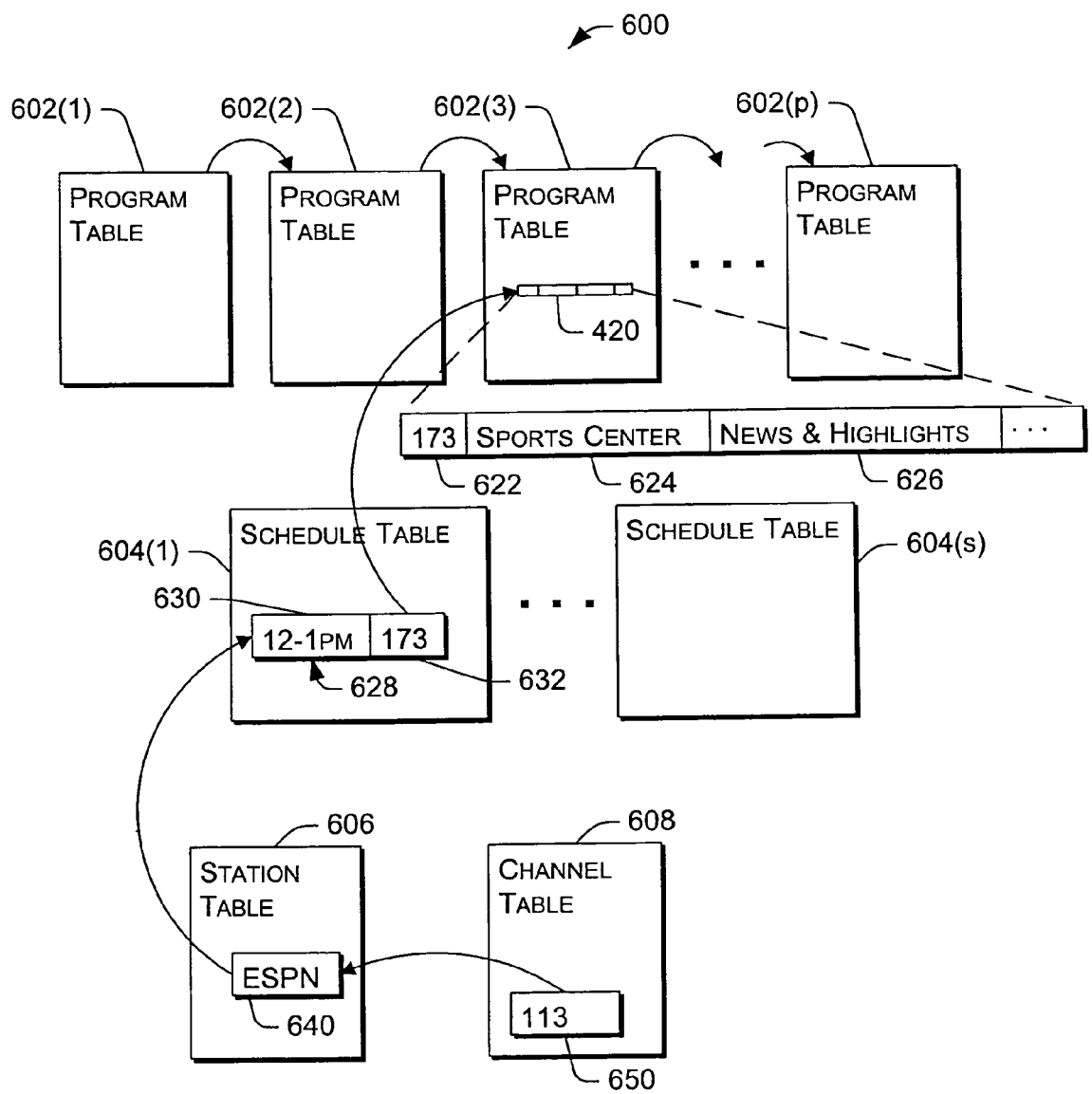
FIG. 6 illustrates tables used to organize program data.

FIG. 6 shows exemplary EPG data 600 to be delivered to the client. The EPG data 600 is stored in multiple tables, where individual tables are employed to store similar data of a particular type. In the illustrated example, there are one or more program tables 602(1), 602(2), 602(3), . . . , 602(p) containing program listings, one or more schedule tables 604(1), . . . , 604(s) containing schedule-related data, a station table 606 containing station information, and a channel table 608 containing real/virtual channel and frequency information.

The tables store the program data in records. For example, the program tables 602 consist of records pertaining to programming information, as represented by program record 620. Each program record 620 has one or more fields, such as a program identifier field 622, a program title field 624, a program description field 626, and so on. The schedule table 604 has records pertaining to scheduling information, as represented by program record 628. Each schedule record 628 has one or more fields, such as a time field 630 and a program identifier field 632. The station table 606 has records pertaining to station information, as represented by station record 640. These station records 640 may include one or more fields used to identify a station, such as its call letters, a corporate entity description, and so on. The channel table 608 stores records pertaining to channel information, as represented by channel record 650. The channel records 650 may include one or more fields used to identify a channel, such as a channel identifier, a channel frequency, and so on.

The tables are related so that records in one table can cross-index into related information in one or more other tables. For instance, the channel record 650 in channel table 608 may index to a station record 640 in the station table to identify the call letters for the channel identifier. That station record 640 may then index into the schedule table 604 to identify multiple records 628 defining the schedule for that station. The schedule records 628 may further reference individual program records 620 in the program tables 602. The program records 620 hold the details of the programs corresponding to the time slots identified in the schedule table 604 for the particular station or channel.

The tabular data structure 600 represents the native form of the EPG data that can be delivered, via broadcast or other means, to the clients. The EPG data can be indexed by channel to allow individual networks to obtain the appropriate EPG data for their clients. The EPG program at the client understands the native form and can process the data to perform various operations. In its unsorted state, however, the EPG data is not conducive to fast searches on the low resource client. The client is faced with either sorting the existing EPG data on its own, which is resource expensive, or performing lengthy searches on unsorted data, which is slow.

Figure 7:
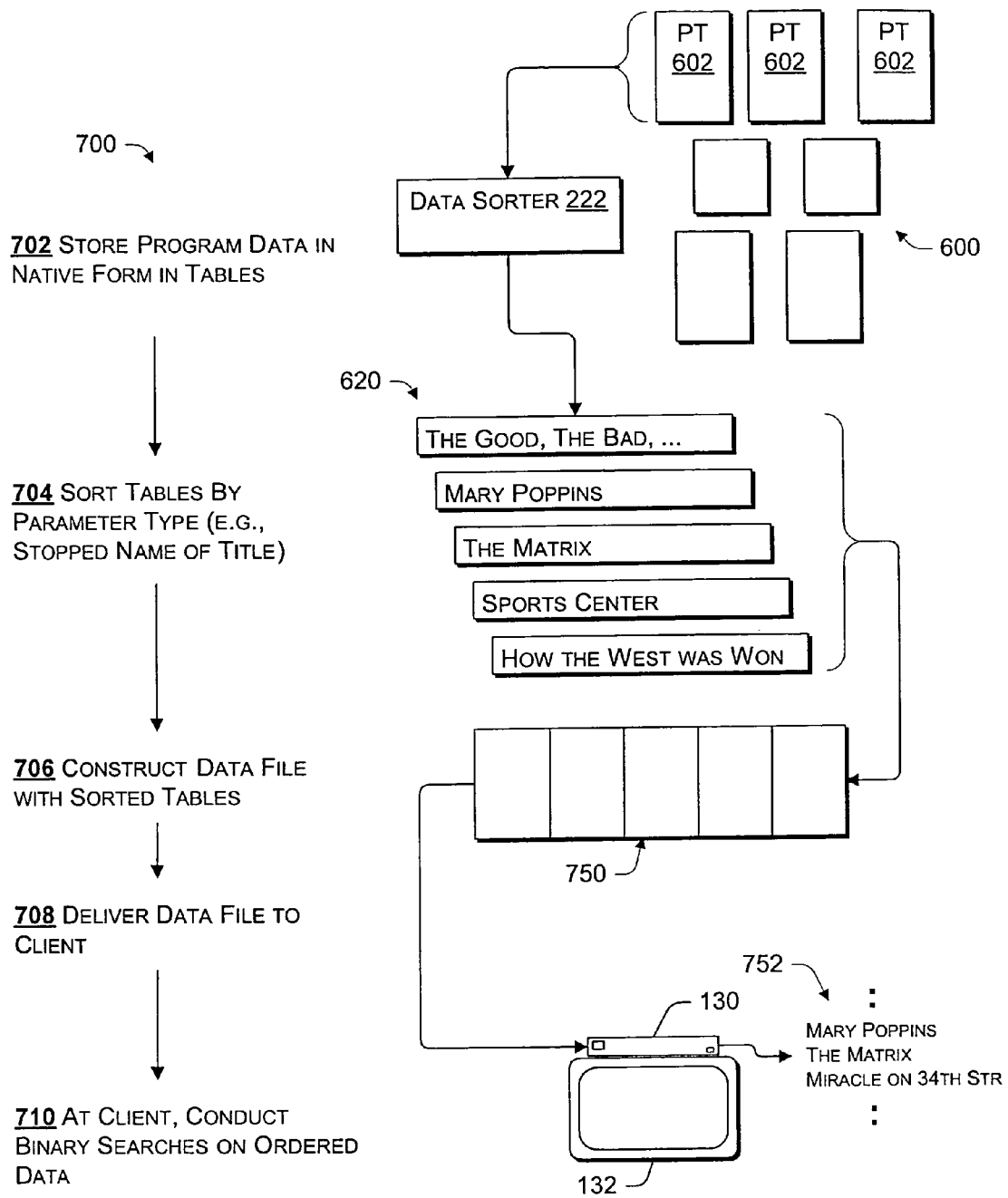
FIG. 7 illustrates an exemplary sorting process in which the program data is sorted prior to delivery to the clients.

FIG. 7 illustrates one exemplary implementation of the sorting process 700 for sorting the EPG data 600. The process is described with reference to a diagrammatic illustration depicting exemplary components of the television entertainment system 100 that might be used to perform the enumerated operations.

At 702, the program data is stored in native form in multiple tables. This is represented by the tabular data structure 600 shown in FIG. 4, and diagrammatically illustrated in FIG. 5. The program listings are thus originally stored in program tables 602 in the order produced by the EPG data publisher 102.

At 704, the data sorter 222 at the EPG server 110 sorts the program data in the tables by a specific parameter type that a viewer is anticipated to want to search. For example, in one implementation, the data sorter 222 arranges EPG data in the program tables alphabetically according to the "stopped name" of the program. The "stopped name" of a program is the shortened version of the program title that contains the identifying words, without common joiner words such as "the", "and", etc. For example, the movie "The Good, The Bad, and The Ugly" might have a stopped name of "Good, Bad, Ugly" and the program "How the West was Won" might have a stopped name of "West Won".

An example set of program records 620 for different programs is shown in FIG. 7. Notice that the program record for the movie "The Good, The Bad, and The Ugly" is ordered alphabetically under "G" rather than under "T". Similarly, the movie "The Matrix" is arranged under "M" and the program "How the West was Won" is sorted under "W". The data may be sorted using other data types as well. For example, the data sorter 222 may arrange the EPG data according to actor names, or program genre, or ratings.

If there is EPG data for multiple days, the data sorter 222 sorts the program records for each day independently of the other. This will produce multiple sets of sorted program data for corresponding multiple days. Alternatively, all of the records for all of the days can be sorted together. It is also noted that other servers besides the EPG server 110 may be employed to perform the sorting techniques as described herein, such as servers at head end services 120.

At 706, the EPG server 110 constructs a data file 750 for delivery to the client. The data file 750 holds the tables, including the sorted program tables. If there is EPG data for multiple days, one data structure is constructed for each day. The one or more data structures 750 may then be broken into multiple chunks that may or may not be the same size. Each chunk is atomic, containing a range of records and an index to describe where the records in the table(s) fit within the context of the whole EPG data file. Each chunk may hold parts of one table or up to multiple tables. Individual tables know in which chunk they reside. Table boundaries are therefore different than chunk boundaries, although they may coincide.

At 708, the data file 750 is delivered to the client 130 via the head end service. When the client 130 receives the data file, it stores the data file in RAM 310.

At 710, the client performs a search over the data structure stored in RAM. Due to the pre-sorted arrangement of the records, the client is able to perform a simple and fast binary search on the data. For instance, suppose viewer is interested in locating the movie, "The Matrix". The client's search engine 324 performs a binary search through the title fields of the program records, comparing two titles at a time. Here, the movie "The Matrix" is ordered after "Mary Poppins" and before "Miracle on 34$^{th}$ Street" as represented by title listing 752.

Where data structures for multiple days exist, the search engine 324 performs a two-phase searching process. A first phase involves a binary search of the program data for each day to produce intermediate results. Suppose, for example, that the program data covers five days, Monday through Friday. The first phase produces search results for each data, Monday through Friday. A second phase combines the daily results produced from the first phase and sorts them. The final results are then returned.

Fragmentation of Program Data

Another process that may be performed on the EPG data prior to delivery to the client concerns formatting the EPG data into multiple blocks of a predetermined size. The client 130 designates an arbitrary data size and allocates a portion of its memory in segments of that size. The arbitrary size is communicated to the EPG server 110. The data structure fragmenter 220 "fragments" the publisher-created EPG data 104 stored in the EPG database 108, or a subset of that data, in advance of delivery to the client 130.

When finally delivered, the fragmented data fits neatly into the pre-allocated segments of the client memory. As a result, system calls to the memory for purposes of accessing EPG data are greatly reduced or eliminated, resulting in less fragmentation of memory and more efficient storage of the EPG data. It is noted that the fragmentation process may be performed at other computing sites in system 100, including at the head end services 120.

Figure 8:
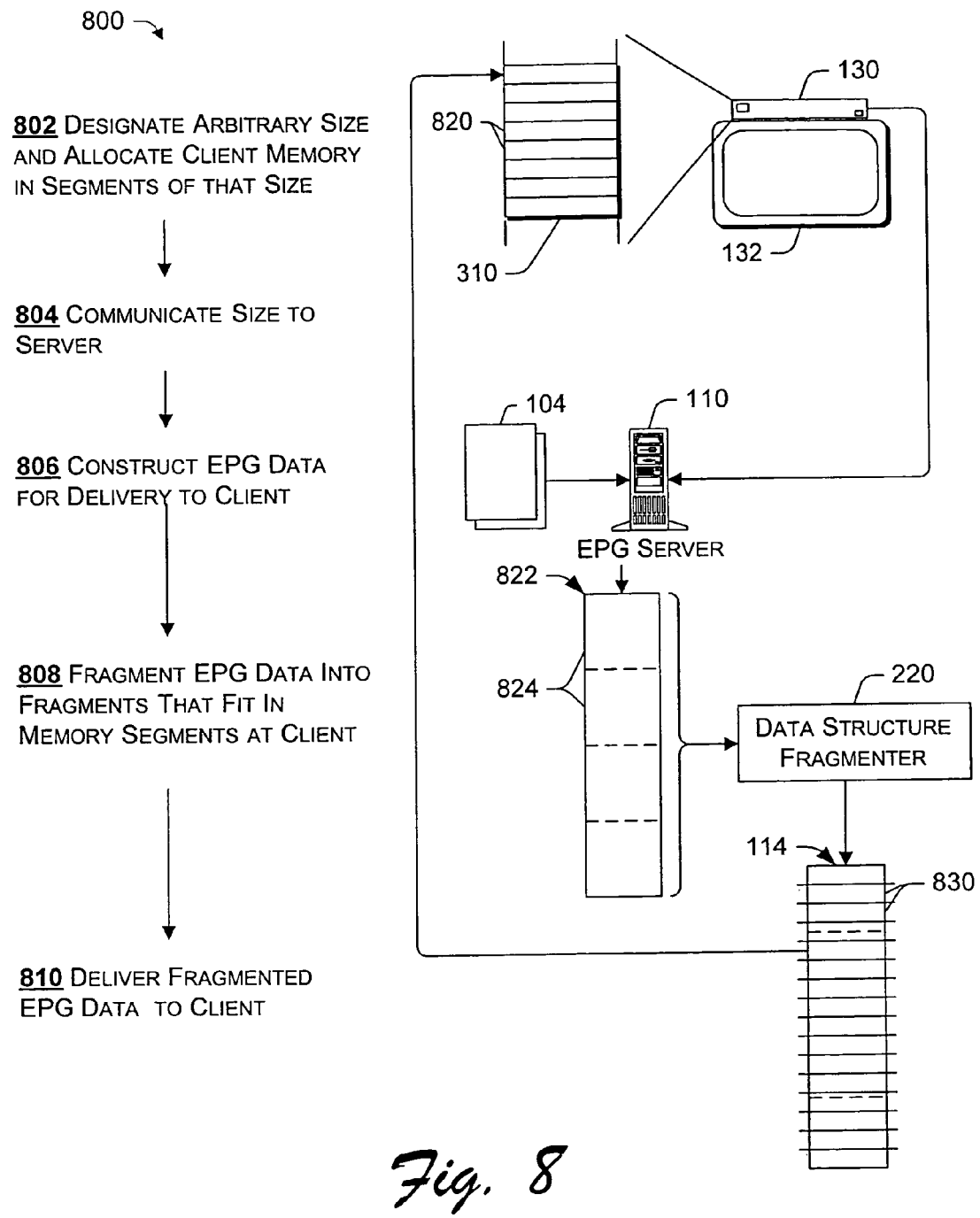
FIG. 8 illustrates an exemplary fragmentation process in which the program data file fragmented prior to delivery to the clients.

FIG. 8 illustrates one exemplary implementation of the fragmentation process 800. The process is described with reference to a diagrammatic illustration depicting exemplary components of the television entertainment system 100 that might be used to perform the enumerated operations.

At 802, the client 130 designates an arbitrary data size and allocates a portion of its memory 310 into segments 820 of that size. As one example, the memory segments 820 are equal size segments of 16K bytes. This memory allocation size might alternatively be specified by the manufacturer.

At 804, the client 130 communicates the size of the memory segments 820 to an upstream server, such as EPG server 110. Alternatively, the segment size of the client memory may be a parameter that is already known to the EPG server 110. For instance, the clients may be configured during manufacturing to allocate the memory designated for holding EPG data in certain size segments. This parameter could then be provided to the EPG server 110 as the target size for the data fragments. It is also noted that other servers besides the EPG server 110 may be employed to perform the fragmentation techniques as described herein, such as servers at head end services 120.

At 806, the EPG server 110 begins producing the EPG data file for delivery to the client. The EPG server 110 may structure and format the data file in many ways. One approach is to construct multiple tables that hold various types of EPG data, such as the table structure 600 of FIG. 6. Each table is self-contained in that it knows its type and contents. The tables are arranged in a data structure, which is represented as structure 822 in FIG. 8.

The table data structure 822 is broken into multiple chunks 824 that may or may not be the same size. Each chunk 824 is atomic, containing a range of records and an index to describe where the records in the table(s) fit within the context of the whole EPG data file. Each chunk 824 may hold parts of one table or up to multiple tables. Individual tables know in which chunk they reside. Table boundaries are therefore different than chunk boundaries, although they may coincide.

At 808, the data structure fragmenter 220 fragments the table structure 822 into smaller size fragments 830. Each structure fragment 830 is capable of fitting in a corresponding memory segment 820. More particularly, in our example, the EPG data fragments 830 are of a size that is guaranteed to be less than or equal to the arbitrary size designated by the client 130, or less than or equal to 16K bytes. Notice that the fragment boundaries may or may not coincide with the chunk boundaries and/or table boundaries.

At 810, the fragmented data file 114 can be delivered to the client 130 via the head end service. When the client 130 receives the fragmented data, the client stores the data fragments 830 in respective pre-allocated segments 820 without making system calls to the memory. When the client subsequently makes a call to free memory, the memory is provided in the fixed-size segments. In this way, fragmentation is constrained to the fixed-size spaces that can be more easily managed, thereby eliminating the need for memory management techniques such as de-fragmentation or garbage collection processes.

It is noted that the fragmentation process may be performed on either non-compressed or compressed data. If performed on compressed data, the fragmentation process is executed following the compression process described in the next section.

Generating Searchable Compressed Data

Due to the limited memory at the low resource client, another process that can be performed on the EPG data prior to delivery is to compress the EPG data in a manner that facilitates searching of the data in its compressed state. The following discussion provides one exemplary approach to generating and searching compressed data. The techniques described below can be performed on essentially any string of bits, and is particularly well suited for alphanumeric text strings. For continuity purposes and ease of understanding, the techniques are described in the context of compressing the EPG data at the EPG server and then searching the compressed EPG data at the client. The general process is described first, followed by a more detailed explanation of one exemplary implementation that utilizes the ASCII standard.

Figure 9:
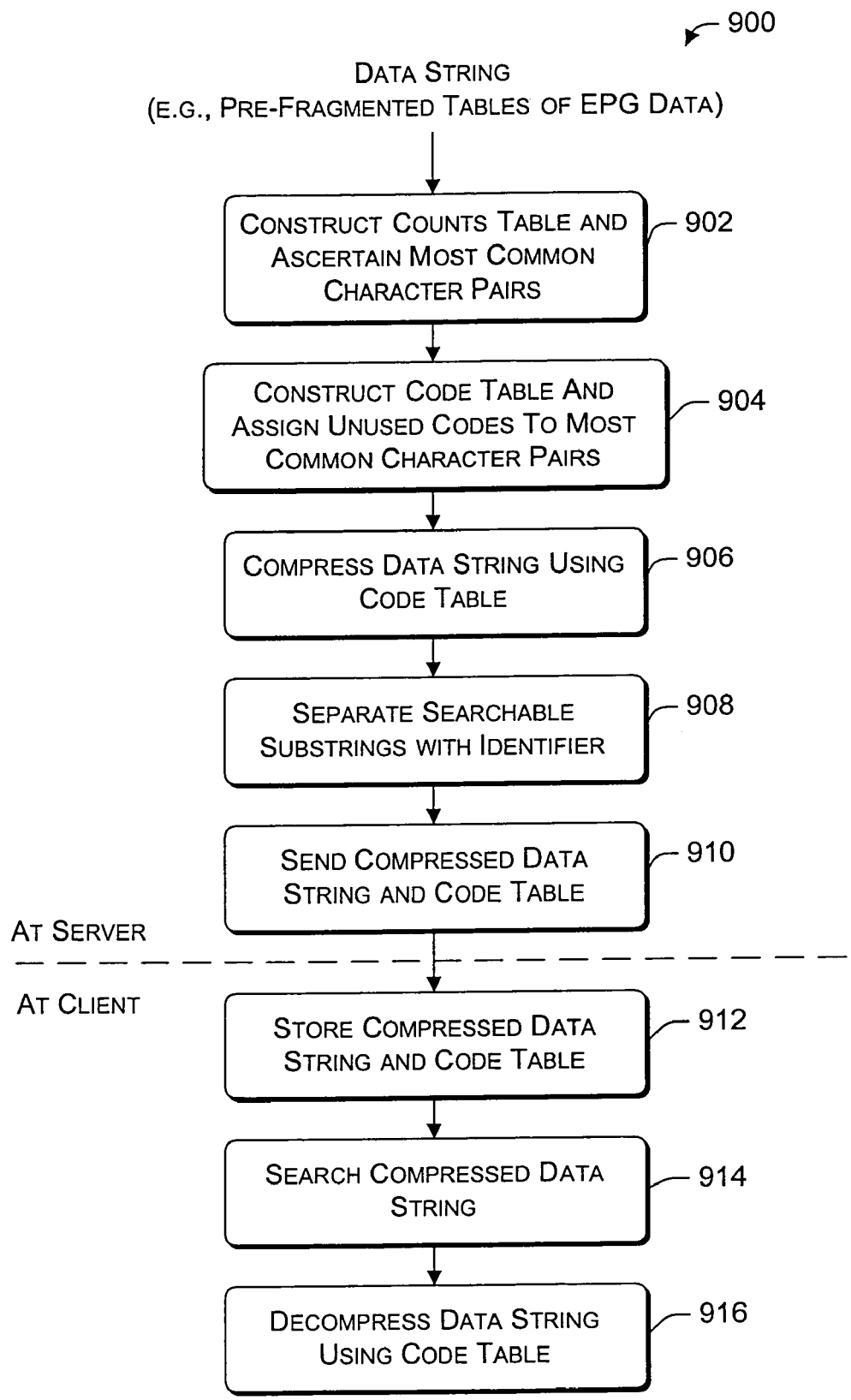
FIG. 9 is a flow diagram of a process for generating and searching compressed data.

FIG. 9 shows an exemplary process 900 for generating and searching compressed data. Generally, the process 900 includes a server-based phase and a client-based phase. In this server-based phase, data (e.g., EPG data) is compressed into a format that is readily searchable by the client, including low-resource clients. This first phase can be performed by the data compressor 226 executing at the EPG server 110, or by other computing sites in system 100, such as at the head end services 120. The client-based phase is performed at the client. It involves searching the compressed data in its compressed state, as well as decompressing the data when used.

The process 900 may be implemented in software, firmware, hardware, or a combination of these. The process is illustrated as a set of operations that may be implemented as computer-executable instructions that can be executed at the server and the client. A dashed line distinguishes the operations being performed in the two phases by the different computing devices.

At 902, the process receives an input data string and makes a pass through, counting each pair of characters. This data string can be essentially any string of alphanumeric characters. In our example, the data string is a string of primarily text characters that form the EPG data in the fragmented tables. The data compressor 226 constructs a counts table that contains entries for every possible character pair, and counts the number of occurrences of each pair in the input data string. When the entire data string has been evaluated, the data compressor ascertains which character pairs are the most common by comparing the counts. Those pairs with the highest counts are the most common.

At 904, the data compressor 226 constructs a code table that associates codes with characters and the most common character pairs found in the data string. The code table contains a standard code set (e.g., ASCII code set) that includes codes for every character in the data string as well as codes that are normally unused. The data compressor 226 assigns unused codes to the most common character pairs identified in the counts table.

At 906, the data compressor 226 compresses the alphanumeric data string using the codes in the code table. The most common character pairs are replaced with shorter codes to reduce the amount of data. This substitution produces a compressed data string that is significantly smaller than the original input string.

At 908, to facilitate searching of the compressed data string, identifiers are inserted between substrings to separate the compressed data string into searchable portions. For instance, in the EPG data, the process may place identifiers (e.g., one or more zeros) between program titles, or actor names, or any other items that a viewer is anticipated to want to search.

At 910, the server packages the compressed data string and code table in a data file that is delivered to the client. The data file may be directly distributed to the client, or via the head end services.

At 912, the client stores the compressed data string and code table in RAM 310, as shown in FIG. 3. This is beneficial for low-resource clients with limited memory capabilities because more EPG data can be stored at the client.

At 914, the client is able to search the compressed data string in its compressed state. In the described implementation, the search engine 324 searches the compressed EPG data by compressing at least a portion of the search query and then comparing the compressed search query with substrings in the compressed data string. The search engine can rapidly skip from substring to substring by keying on the identifiers that separate the substrings.

At 916, the client-side decompressor 320 can decompress all or a portion of the compressed data string using the code table. The decompressor 320 passes through the compressed data string, substituting the character pairs in the code table for the associated codes in the compressed string to expand the data string back to its original size.

Various operations of the process 900 will now be described in more detail. For discussion purposes, the detailed example is described in the context of using the 256-character set of ASCII (American Standard Code for Information Interchange) codes. Each ASCII character is represented as an eight-bit byte, which can be represented in hexadecimal as a set of codes ranging from 00 (i.e., 0000 0000) to ff (i.e., 1111 1111). It is noted, however, that other code sets may be used, such as EBCDIC (Extended Binary Coded Decimal Interchange Code), UTF8, 8-bit Unicode, and the like.

Table Construction (902 and 904)

Figure 10:
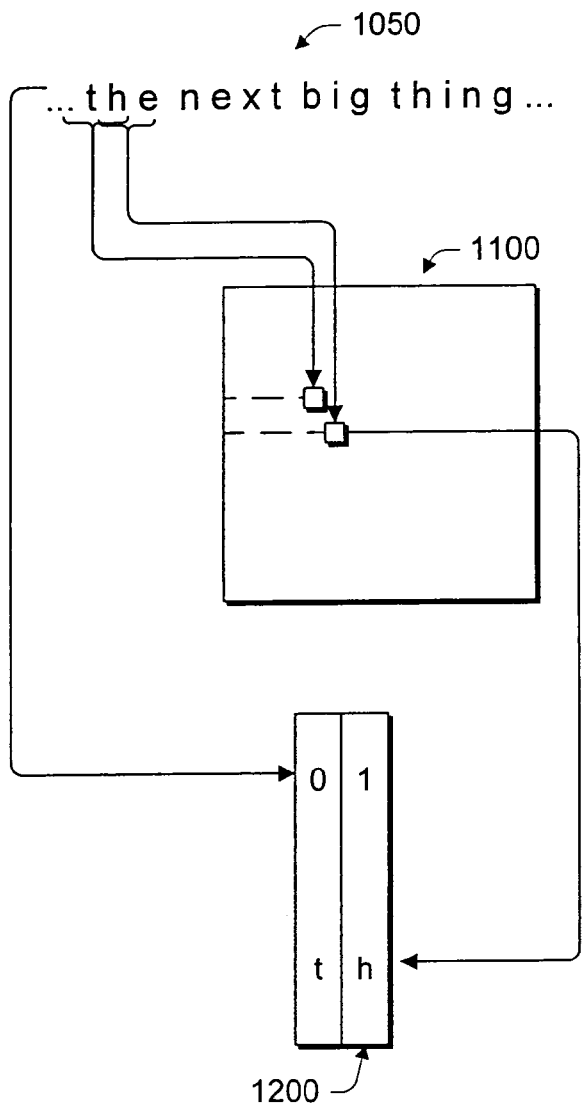
FIG. 10 illustrates exemplary table construction operations of the FIG. 9 process in which a counts table and a code table are constructed and filled.

FIG. 10 shows one exemplary implementation of the table construction operations of 902 and 904 in FIG. 9. The process is described with reference to a diagrammatic illustration depicting a counts table 1100 and a character code table 1200.

At 1002, the counts table 1100 and the character code table 1200 are initialized. An exemplary counts table 1100 is shown in more detail in FIG. 11. It is a 256×256 table. The rows represent the first character in a character pair of the input data string and the columns represent the second character in the character pair. Thus, the counts table 1100 contains entries for every possible character pair combination.

An exemplary character code table 1200 is shown in more detail in FIG. 12. It is a 256×2 table, with 256 rows representing the 256 ASCII codes and two columns. Since not all codes are used to represent single characters and other punctuations (e.g., commas, periods, quotations, etc.) in the data string, some normally unused codes are available to represent the most common character pairs identified in the counts table 1100. In the described implementation, the tables 1100 and 1200 are initialized to all zeros.

At 1004 in FIG. 10, the data compressor 226 makes a first pass through the input data string and counts each occurrence of character pairs. With each count of a character pair, a corresponding entry in the counts table 1100 is incremented. Suppose the input data string contains the textual substring "... the next big thing ...", identified by reference number 1050. As the compressor 226 evaluates this substring 1050, it increments the count for the character pairs "th", "he", "e_", "_n", "ne", and so on (where "_" represents a space).

Figure 11:
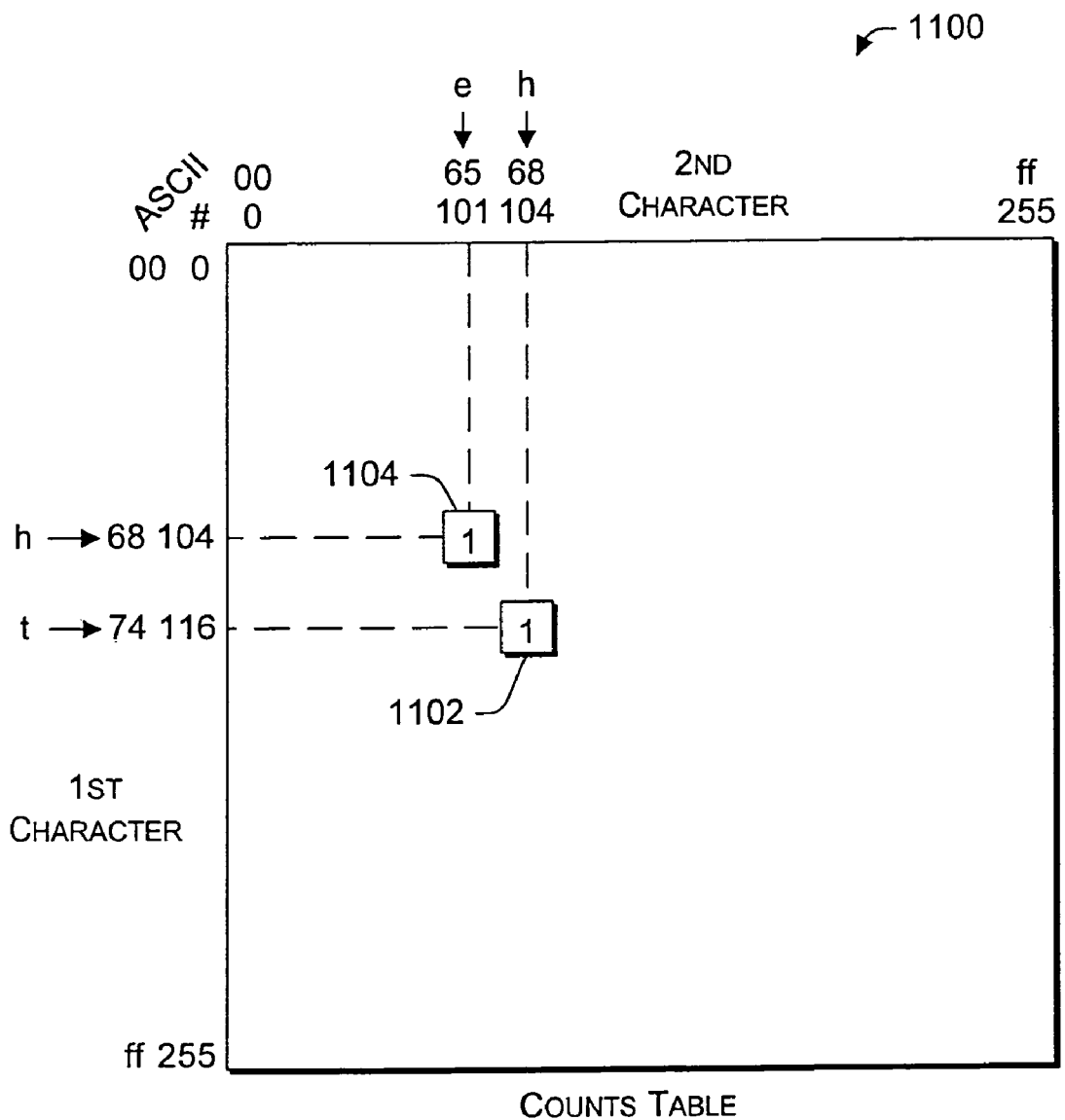
FIG. 11 illustrates an exemplary counts table used to hold counts of the number of occurrences of character pairs in an input data string being compressed.

Notice in FIG. 11 that a count field 1102 associated with the character pair "th" is incremented to a value "1" as shown. The character "t" is represented in ASCII as hexadecimal 74 (decimal 116) and the character "h" is represented in ASCII as hexadecimal 68 (decimal 104). Similarly, a count field 1104 associated with the character pair "he" is incremented to a value "1". As the data string is traversed, the count values are incremented to reflect the number of occurrences of individual character pairs.

At 1006, the data compressor determines the N most common character pairs in the data string. Character pairs are ascertained as being the most common by comparing the counts. Those pairs with the highest counts are the most common. The number N is a variable that can be preset or made dependent upon how many codes in the code table 1200 are available for assignment to character pairs.

At 1008, the data compressor 226 marks the single characters found in the input data string as used in the code table 1200. When a character is found in the data string, the value in the right column "R" is changed to 1 to represent that it is being used. This is represented in FIG. 12 with entries for "t", "h", and "e".

At 1010, after all single characters and any punctuation symbols are marked, unused codes in the code table 1200 are assigned to represent the most common character pairs with the highest counts. As shown in FIG. 12, the left column "L" holds the first character and the right column "R" holds the second character. Suppose that the character pairs. "th" and "t_" are found to be among the most common character pairs. An unused entry 8*f* (or 143) in code table 1200 is assigned to character combination "th" and an unused entry bd (or 189) is assigned to character combination "t_".

Compression (906 and 908)

Figure 13:
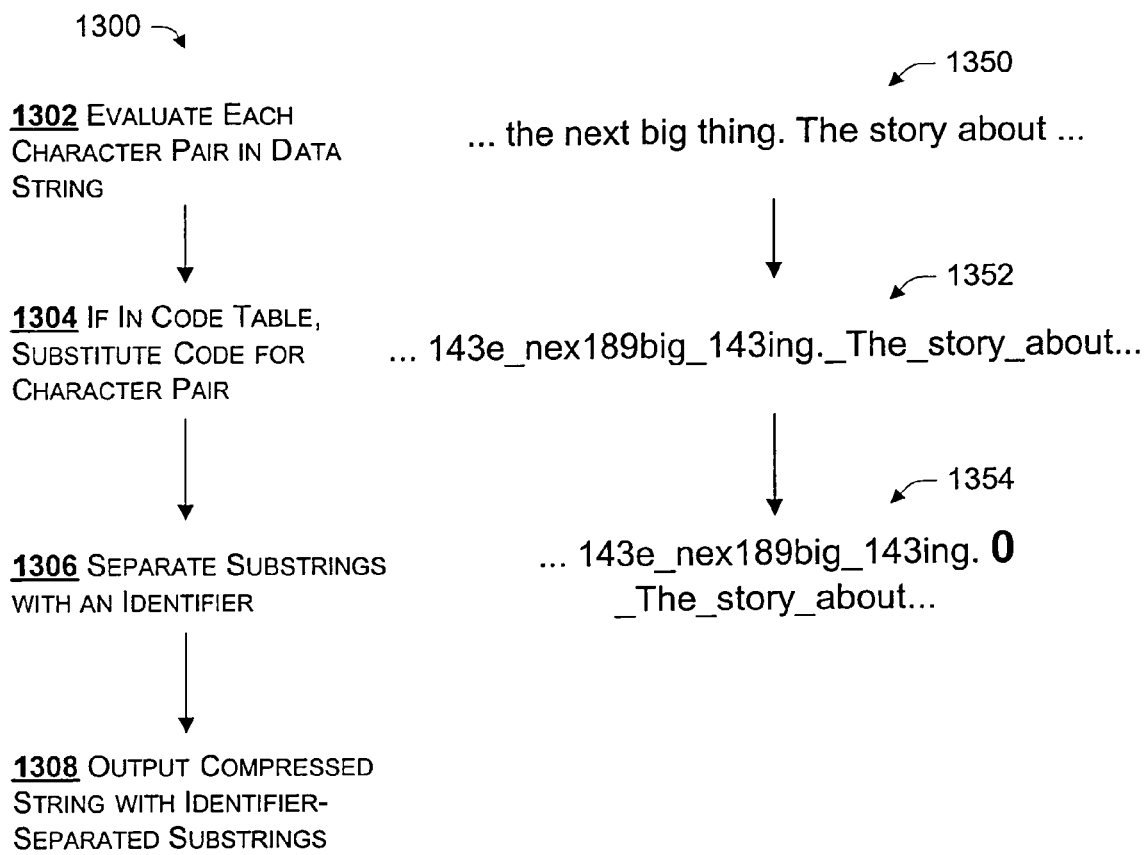
FIG. 13 illustrates exemplary compression operations of the FIG. 9 process in which the input data string is compressed using the code table.

FIG. 13 shows one exemplary implementation of the compression operations of 906 and 908 in FIG. 9. The process is described with reference to a diagrammatic illustration of progressively compressed strings. At 1302, every character pair in the input data string is evaluated. A portion of our example data 19 string is shown as ". . . the next big thing. The story about . . . ", and is referenced as number 1350.

At 1304, if a character pair is represented in the code table (i.e., one of the most common character pairs), the code is substituted for the character pair. In the illustrated example, the character pair "th" is twice replaced with the code value 143, and the character pair "$t_{13}$" is once replaced with the code value 189. This produces a compressed data string, as represented by compressed portion 1352. Each substitution results in a 50% reduction as the two bytes of each character pair are replaced with a one-byte code. It is noted that one or more passes may be made through the data string to produce the compressed data string. Notice also that the character pair "Th" is different than the character pair "th" due to the different case of the letter "T" in the former, and hence is not replaced with the code for "th". Additionally, the single characters in the compressed data string are shown in their character format for ease of discussion and illustration, but may be replaced with their corresponding codes in the compressed data string.

At 1306, compressed substrings are separated with a unique identifier. In this example, a zero is used to separate adjoining substrings, as represented in compressed data string portion 1354. However, identifiers other than zero may be used. This separation facilitates quick searching of the compressed substrings, even at a low resource client. At 1308, a compressed data string with identifier-separated substrings is output.

Client-Based Searching (914)

Figure 14:
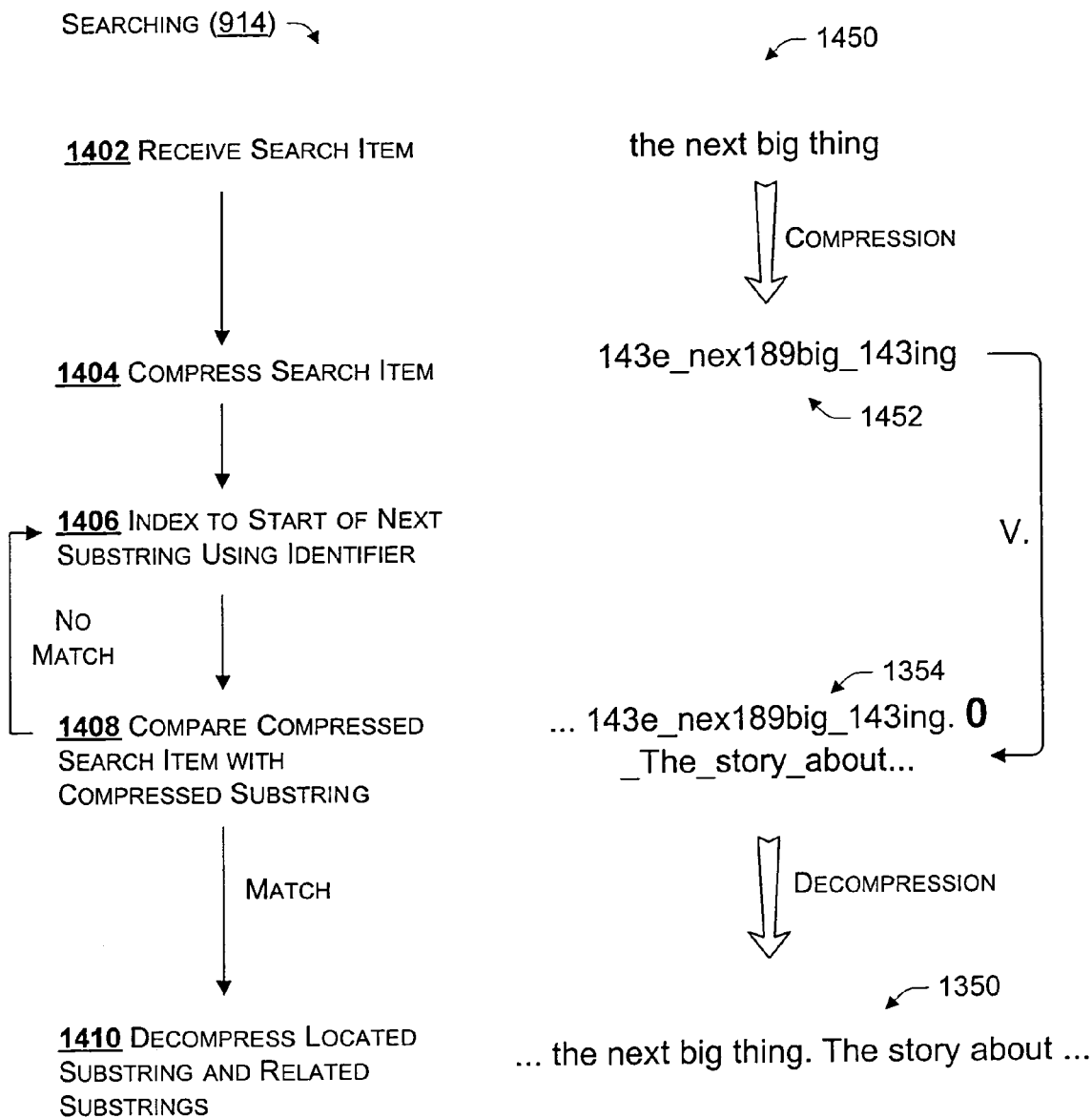
FIG. 14 illustrates an exemplary searching operation of the FIG. 9 process in which a client searches the compressed data string in its compressed state.

FIG. 14 shows one exemplary implementation of the searching operation 914 in FIG. 9 that is performed at the client on the compressed data. The process is described with reference to a diagrammatic illustration of an example search item. At 1402, the client receives a search item. This search query may be generated, for example, when the viewer selects a program from the EPG user interface. The search item can be on essentially any type of data. In the context of EPG data, the search item may be a title, actor name, rating, program genre, schedule time, station, and so forth. An example search item 1450 contains the text string "the next big thing."

At 1404, the client compresses the search item using the same compression process described with reference to FIG. 13. The client examines each character pair in the search item and replaces pairs represented in the code table with the code. This produces a compressed search item 1452.

At 1406, the client indexes to the first or next substring in the compressed data string stored in memory. The client uses the substring identifier (e.g., a zero) to rapidly skip from substring to substring.

At 1408, the compressed search item is compared to at least a portion of each compressed substring. In this example, the compressed search item 1452 is compared with each compressed substring 1354. When no match is found, the client proceeds to the next substring by skipping ahead to the next identifier. If a match is found, the client decompressor 320 decompresses the substring and any related substrings at 1410 to reproduce the original string. 1350.

Client-Based Decompression (916)

Figure 15:
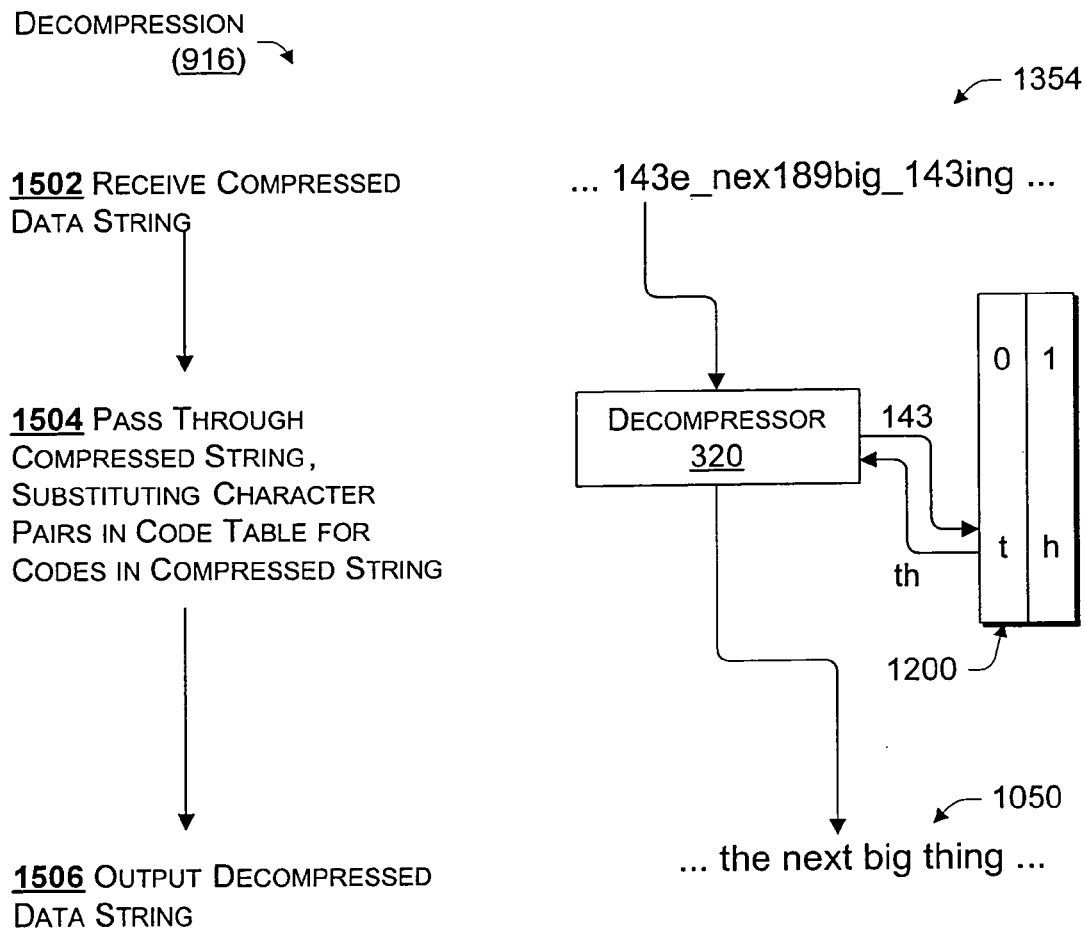
FIG. 15 illustrates an exemplary decompression operation of the FIG. 9 process in which the client decompresses the compressed data string.

FIG. 15 shows one exemplary implementation of the decompression operation 916 in FIG. 9 that is performed at the client. The process is described with reference to a diagrammatic illustration of decompressing the compressed substring 1354. At 1502, the decompressor receives the compressed string of data, as represented by substring 1354. The decompression operation may be performed on the entire data string, or portions thereof.

At 1504, the decompressor 320 makes a pass through the compressed data string. When the decompressor encounters a code, the decompressor uses the code to index the code table 1200 and replaces the code in the compressed string with the associated character pair from the code table 1200. This is illustrated by the code 143 referencing the associated character pair "th" in the code table. When the string portion "143e" is decompressed, the code 143 is replaced with the character pair "th" to thereby expand the data string back to its original content.

At 1506, the decompressor 320 outputs the decompressed data string, or substring, for use by the client. In the context of EPG data, the decompressed data string can be passed to the EPG 322.

Conclusion

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

The invention claimed is:

1. A method comprising:
   compressing an alphanumeric data string to form a compressed data swing;
   inserting identifiers throughout the compressed data string to form distinct substrings;
   fragmenting the data string into equal-size fragments prior to delivery of the data string to a remote client; and
   searching the compressed data string using the identifiers to index from substring to substring.

2. A method as recited in claim 1, wherein the compressing comprises substituting available character codes in a character code set that are not used to represent individual characters in the data string for selected character pairs in the data string.

3. A method as recited in claim 1, further comprising:
   identifying frequently occurring character pairs in the alphanumeric data string;
   constructing a code table with first codes that represent individual characters in the data string and second codes that can be assigned to represent the frequently occurring character pairs in the data string; and
   compressing the data string by substituting the second codes for the frequently occurring character pairs.

4. A method as recited in claim 3, wherein the identifying comprises:
   using a counts table with counts associated with every possible combination of two characters; and for each character pair in the data string, incrementing a count associated with the character pair in the counts table.

5. A method as recited in claim 3, wherein the constructing comprises:
marking in the code table individual characters found in the data string and associating the first codes with the individual characters; and
assigning any remaining codes as the second codes to represent the frequently occurring character pairs.

6. A computer-readable medium comprising computer-executable instructions that, when executed, direct a computing device to perform the method as recited in claim 1.

7. A method for preparing program data for delivery to a client that executes an electronic program guide, comprising:
initially allocating different-size portions of memory representative of a client memory for different time units represented in the electronic program guide;
evaluating whether program data for the different time units fits in the respective different-size portions of the memory; and
adjusting quantities of the program data for the different time units to identify an entire set of program data for storage at the client, wherein different quantities of the program data are stored for the different time units.

8. A method as recited in claim 7, further comprising fragmenting the program data into equal-size fragments prior to delivery to the client.

9. A method as recited in claim 7, wherein the time units comprise 24-hour days.

10. A method as recited in claim 7, wherein the allocating comprises allocating more of the memory for time units that are closer in time and less of the memory for time units that are further out in time.

11. A computer-readable medium comprising computer-executable instructions that, when executed, direct a computing device to perform the method as recited in claim 7.

12. A method comprising:
forming a data string of program data for an electronic program guide;
compressing the data string by identifying frequently occurring character pairs in the data string and substituting character codes from a character code set, which are not used to represent individual characters, in place of the frequently occurring character pairs; and
fragmenting the data string into equal-size fragments prior to delivery of the data string to a remote client.

13. A method as recited in claim 12, further comprising:
storing the program data in multiple tables, each table comprising one or more records with one or more fields; and
sorting the records in the tables according to a selected field type prior to delivery of the program data to the remote client, wherein the records form the data string.

14. A method as recited in claim 13, wherein the tables comprises a particular structure and the sorting rearranges the records without changing the particular structure.

15. A method as recited in claim 13, wherein the selected field type is selected from a group of fields including actor names, program genre, title, and ratings.

16. A method as recited in claim 13, wherein the records comprise program records containing programming information, individual program records having a title field to identify a program name, and the sorting comprises arranging the program records in the tables according to a stopped name version of the program name in the title field.

17. A method as recited in claim 12, further comprising:
compressing the data string to form a compressed data string;
inserting identifiers throughout the compressed data string to form distinct substrings; and
searching the compressed data string using the identifiers to index from substring to substring.

18. A computer-readable medium comprising computer-executable instructions that, when executed, direct a computing device to perform the method as recited in claim 12.

* * * * *

UNITED STATES PATENT AND TRADEMARK OFFICE
CERTIFICATE OF CORRECTION

PATENT NO.          : 7,026,964 B2
APPLICATION NO.     : 11/082391
DATED               : April 11, 2006
INVENTOR(S)         : Baldwin et al.

It is certified that error appears in the above-identified patent and that said Letters Patent is hereby corrected as shown below:

In column 4, line 41, delete "processing;" and insert -- processing --, therefor.

In column 6, line 43, after "404(1)" delete "11".

In column 6, line 52, delete "inclusion," and insert -- inclusion --, therefor.

In column 15, line 6, delete "pairs." and insert -- pairs --, therefor.

In column 15, line 17, after "data" delete "19".

In column 15, line 24, delete ""$t_{13}$"" and insert -- "$t\_$" --, therefor.

In column 16, line 43, in Claim 1, delete "swing;" and insert -- string; --, therefor.

Signed and Sealed this

Eighteenth Day of August, 2009

David J. Kappos
*Director of the United States Patent and Trademark Office*